(12) United States Patent
Yan et al.

(10) Patent No.: US 11,086,228 B2
(45) Date of Patent: Aug. 10, 2021

(54) MASK, DEVICE AND METHOD FOR EXPOSURE

(71) Applicants: BOE Technology Group Co., Ltd., Beijing (CN); Ordos Yuansheng Optoelectronics Co., Ltd., Inner Mongolia (CN)

(72) Inventors: Chunlong Yan, Beijing (CN); Long Zhen, Beijing (CN); Qiang Li, Beijing (CN); Delong Wang, Beijing (CN); Zecheng Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

(*) Notice: Subject to any disclaimer, the term of this patent is extended or adjusted under 35 U.S.C. 154(b) by 220 days.

(21) Appl. No.: 16/101,609

(22) Filed: Aug. 13, 2018

(65) Prior Publication Data
US 2019/0179229 A1     Jun. 13, 2019

(30) Foreign Application Priority Data
Dec. 11, 2017   (CN) .......................... 201711309955.5

(51) Int. Cl.
*G02B 5/22*       (2006.01)
*G03F 1/42*       (2012.01)
(Continued)

(52) U.S. Cl.
CPC ......... *G03F 7/70308* (2013.01); *G02B 5/201* (2013.01); *G03F 1/42* (2013.01); *G03F 1/44* (2013.01); *G03F 7/0007* (2013.01)

(58) Field of Classification Search
CPC ..... G03F 1/38; G03F 1/42; G03F 1/44; G03F 7/70308; G03F 7/0007; G02B 5/201; G02B 5/208
See application file for complete search history.

(56) References Cited

U.S. PATENT DOCUMENTS 4,668,089 A * 5/1987 Oshida .................. G03F 9/7049
356/139.07
4,849,313 A * 7/1989 Chapman ............ G03F 7/70433
430/5
(Continued)

FOREIGN PATENT DOCUMENTS

CN    203502701 U  *  3/2014  ............... G03F 1/44
JP    61-084021    *  4/1986  ......... G03F 7/70691
(Continued)

OTHER PUBLICATIONS

Machine transaltion of JP 61-084021 (1986).*
(Continued)

*Primary Examiner* — Martin J Angebranndt
(74) *Attorney, Agent, or Firm* — Nath, Goldberg & Meyer; Joshua B. Goldberg

(57) ABSTRACT

A mask, a device and method for exposure are provided. The mask of the present disclosure includes: a first transparent region configured to allow light of a first wavelength to pass therethrough and filter out light of a second wavelength; and a second transparent region configured to allow the light of the second wavelength to pass therethrough, wherein the light of the second wavelength is light for exposure.

11 Claims, 3 Drawing Sheets

(51) Int. Cl.
*G03F 1/44* (2012.01)
*G03F 7/00* (2006.01)
*G03F 7/20* (2006.01)
*G02B 5/20* (2006.01)

(56) References Cited

U.S. PATENT DOCUMENTS

| | | | | |
|---|---|---|---|---|
| 5,250,983 A | * | 10/1993 | Yamamura | G03F 7/70425 |
| | | | | 355/125 |
| 5,734,478 A | * | 3/1998 | Magome | G03F 9/7049 |
| | | | | 250/548 |
| 6,136,481 A | * | 10/2000 | Aoki | G02B 5/201 |
| | | | | 430/7 |
| 2006/0228637 A1 | * | 10/2006 | Jackson | G02B 5/223 |
| | | | | 430/7 |
| 2012/0190197 A1 | * | 7/2012 | Hui | G03F 1/76 |
| | | | | 438/689 |

FOREIGN PATENT DOCUMENTS

| | | | | | |
|---|---|---|---|---|---|
| JP | 61-144022 | * | 7/1986 | | G03F 9/00 |
| JP | 02-079415 | * | 3/1990 | | G03F 1/08 |
| JP | 02-187013 | * | 7/1990 | | G03F 9/00 |
| JP | 03-048703 | * | 3/1991 | | H01L 21/027 |
| JP | 04-261537 | * | 9/1992 | | G03F 1/08 |
| JP | 05-232513 | * | 9/1993 | | H01L 29/78 |
| JP | 05-341499 | * | 12/1993 | | G03F 1/08 |
| JP | 2002-305136 | * | 10/2002 | | G03F 7/20 |
| JP | 2002-341526 | * | 11/2002 | | G03F 7/004 |
| JP | 2003-131020 | * | 5/2003 | | G02B 5/20 |
| JP | 2006-047757 | * | 2/2006 | | G03F 7/20 |
| JP | 2009-282386 | * | 12/2009 | | G03F 1/08 |
| JP | 2010-085747 | * | 4/2010 | | G02B 5/20 |

OTHER PUBLICATIONS

Machine translation of JP 03-048703 (1991).*
Machine translation of CN 20350270U (2014).*
Machine translation of JP04-261537 (1992).*
Machine translation of jp 02-187013 (1990).*
Machine translation of jp-05341499 (1993).*
Machine translation of JP 2003-131020 (2003).*

* cited by examiner

MASK, DEVICE AND METHOD FOR EXPOSURE

CROSS-REFERENCE TO RELATED APPLICATIONS

The present disclosure claims the priority to Chinese Patent Application No. 201711309955.5 filed on Dec. 11, 2017, the contents of which are incorporated herein by reference in its entirety.

TECHNICAL FIELD

The present disclosure relates to the field of exposure, in particular, to a mask, an exposure device and an exposure method.

BACKGROUND

When preparing a color filter film (color film) with a progressive exposure machine, a blank region 1 for measuring and aligning through a measuring light needs to be designed on a mask. When a substrate is exposed, the blank region 1 needs to be shaded so as to avoid influence on formation of the color film.

SUMMARY

According to an aspect of the present disclosure, provided is a mask for exposure, including: a shading region configured to allow no light to pass therethrough; a first region configured to allow light of a first wavelength to pass therethrough and filter out light of a second wavelength; and a second region configured to allow the light of the second wavelength to pass therethrough, wherein the light of the second wavelength is the light for exposure.

Optionally, the first wavelength is greater than 800 nm.
Optionally, the first wavelength is 820nm.
Optionally, the second wavelength is smaller than 400 nm.

Optionally, the first region includes: an alignment region configured to align the mask with a substrate; and a measurement region configured to measure a distance between the substrate and an exposure machine.

Optionally, the mask includes a base layer configured to allow light to pass through, and a filter film layer is disposed on the base layer at which the first region is located, the filter film layer is configured to allow the light of the first wavelength to pass therethrough and filter out the light of the second wavelength.

Optionally, the filter film includes a wideband light-splitting film.

Optionally, a shading film is disposed at the shading region.

According to an aspect of the present disclosure, provided is an exposure device which includes the mask described above.

According to an aspect of the present disclosure, provided is a method for exposure which includes: disposing the mask described above between a substrate and a light source; performing a first process on the substrate by using the light of the first wavelength; and exposing the substrate by using the light of the second wavelength, wherein the first wavelength is different from the second wavelength.

Optionally, the substrate includes a plurality of exposure regions spaced from each other at an interval and a spacer region between adjacent exposure regions; and the mask is configured to r expos each of the plurality of exposure regions of the substrate sequentially; wherein the second region of the mask corresponds to one of the plurality of exposure regions of the substrate, and the first region of the mask corresponds to the spacer region of the substrate.

Optionally, the first process includes aligning or measuring.

Optionally, the first region comprises: an alignment region, configured to align the mask with the substrate; and a measurement region, configured to measure a distance between the substrate and an exposure machine.

According to an aspect of the present disclosure, a method for forming a color filter film is provided, the method includes: disposing the mask described above between a substrate and a light source; performing a first process on the substrate by using the light of the first wavelength; and exposing the substrate by using the light of the second wavelength, wherein the first wavelength is different from the second wavelength, and the light of the second wavelength is used for exposing a material of the color filter film.

Optionally, the substrate includes a plurality of exposure regions spaced from each other at an interval and a spacer region between adjacent exposure regions; and the mask is configured to expose each of the plurality of exposure regions of the substrate sequentially. The second region of the mask corresponds to one of the plurality of exposure regions of the substrate, and the first region of the mask corresponds to the spacer region of the substrate.

Optionally, the first process includes aligning or measuring.

Optionally, the first region includes: an alignment region, configured to align the mask with the substrate; and a measurement region, configured to measure a distance between the substrate and an exposure machine.

Optionally, an alignment marker is provided on the spacer region on the substrate, and the alignment marker corresponds to the alignment region in the first region.

DETAILED DESCRIPTION

The present disclosure will be further described in detail below in conjunction with the accompanying drawings and specific embodiments.

Figure 1:
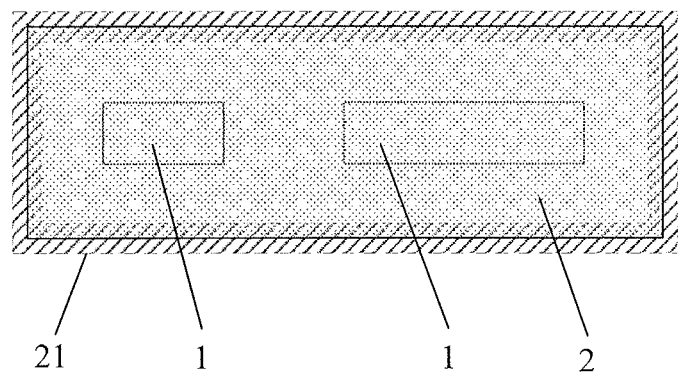
FIG. 1 is a schematic view of shading a blank region by using a shading sheet in the related art.
Figure 2:
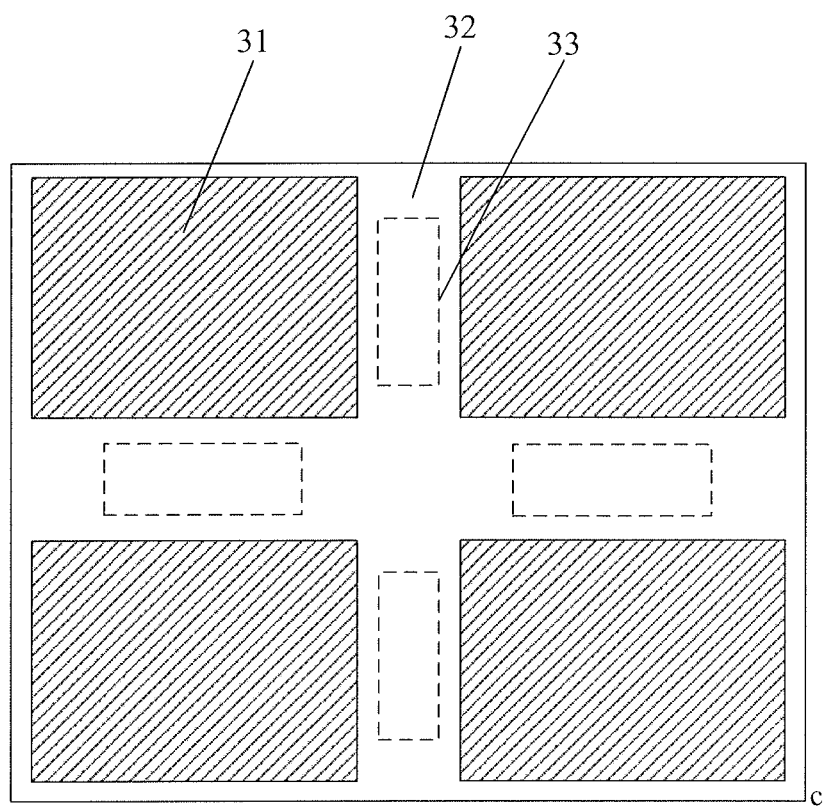
FIG. 2 is a schematic view illustrating positions of respective regions on a substrate when performing exposure using a mask in the related art.

As shown in FIGS. 1 and 2, a blank region is generally shaded by a shading sheet 2. Since a gray region 21 of ±3 mm is located at an edge of the shading sheet 2 as shown in FIG. 2, a region of a substrate that shaded by the shading sheet 2 and a region on the substrate corresponding to the gray region 21 cannot be patterned. However, an unpatterned region 33 on the substrate cannot be used for display. Also, nonuniformity of liquid crystal distribution may occur in the unpatterned region and a surrounding region when the substrate is aligned and assembled to form a cell, causing a problem such as yellowness issue of a displayer.

In order to solve the problem, a redundant pattern that separates the unpatterned region 33 from a patterned region may be designed. In other words, the unpatterned region 33 is separated from a region for displaying by a certain distance so as to avoid influence on display. Specifically, there are two designing methods. One is to design a redundant pattern in a region outside the unpatterned region 33, but this could result in decrease in utilization of the substrate. The other is to design a redundant pattern in the gray region 21, but this could result in blurring and shedding of patterns during a manufacture process of the color filter film due to a poor exposure effect caused by the gray region.

The present embodiment provides a mask applied to an exposure process for preparing a color filter film (color film) or a post spacer (PS) or the like on a substrate. In the present embodiment, preparing the color film by using a mask is taken as an example for description.

Figure 3:
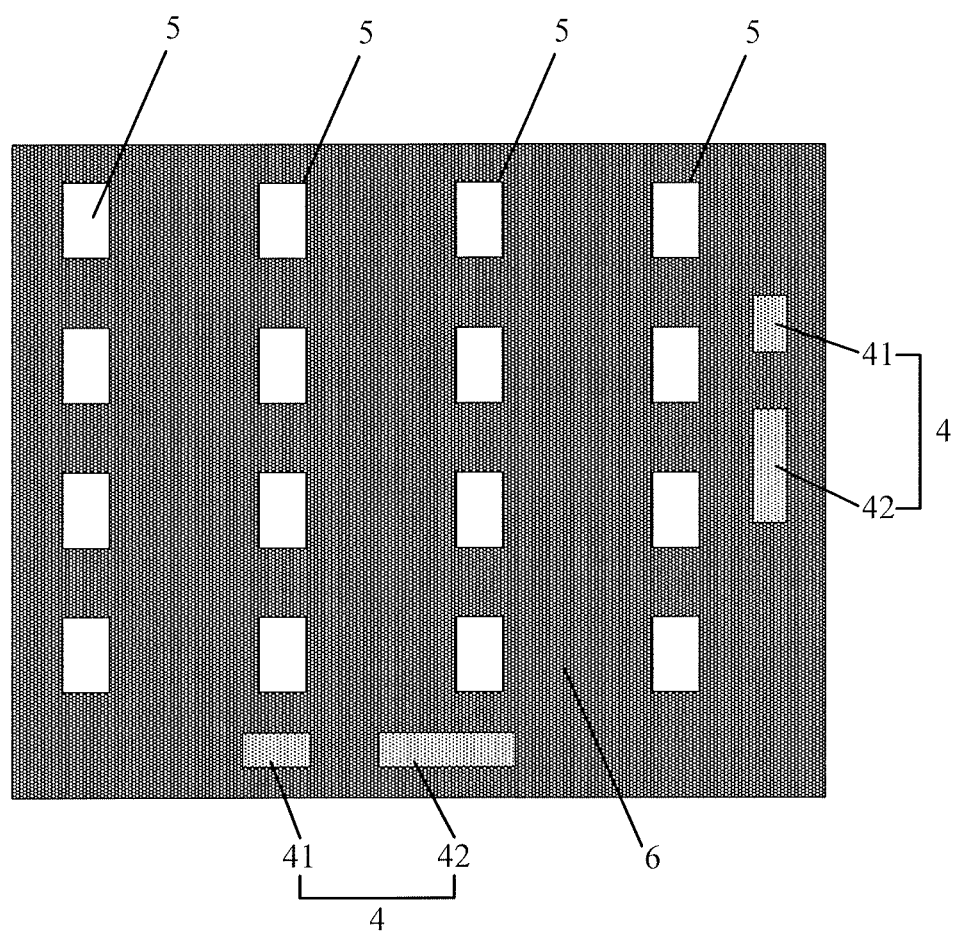
FIG. 3 is a schematic structural view of a mask of an embodiment of the present disclosure.

FIG. 3 is a schematic structural view of a mask of an embodiment of the present disclosure. The mask includes: a shading region 6 configured to allow no light to pass through, that is to block light from passing through it; one or more first transparent regions 4 configured to allow light of a first wavelength to pass through and filter out light of a second wavelength; and one or more second transparent regions 5 configured to allow the light of the second wavelength to pass through, wherein the light of the second band is the light for exposure.

As shown in FIG. 3, in the present embodiment, the second transparent regions 5 and the first transparent regions 4 on the mask are separated by the shading region 6. Each of the first transparent regions 4 includes an alignment region 41 for alignment, and/or a measurement region 42 for measurement. The light of the first wavelength includes measurement light for measurement and alignment light for alignment. Each of the second transparent regions 5 includes a color film pattern for forming a color film, and the light of the second wavelength is the light for exposing a color-film material.

It should be understood that the each of the second transparent regions 5 may not only allow light of the second wavelength to pass therethrough, but also allow light of other wavelengths to pass therethrough, that is, each of the second transparent region 5 is a completely transparent pattern.

Specifically, when the color film is prepared by using the mask provided in the embodiment, the light of the first wavelength may first pass through the first transparent regions 4 (specifically, the measurement light passes through the measurement region 42, and the alignment light passes through the alignment region 41) so as to measure a distance between an exposure machine and the substrate, and/or align the mask with the substrate. The substrate is exposed by irradiating the light of the second wavelength onto the mask. Specifically, a color-film material on the substrate is exposed by irradiating the light of the second wavelength through the second transparent regions 5 so that a corresponding color film pattern is formed. Since the first transparent regions 4 can filter out the light of the second wavelength, the first transparent regions 4 can block the exposure light during the color film exposure, thereby avoiding influence on the preparation of the color film.

It can be understood that the number and position of the first transparent region 4 and the second transparent region 5 can be set as needed, and are not specifically limited herein.

Figure 4:
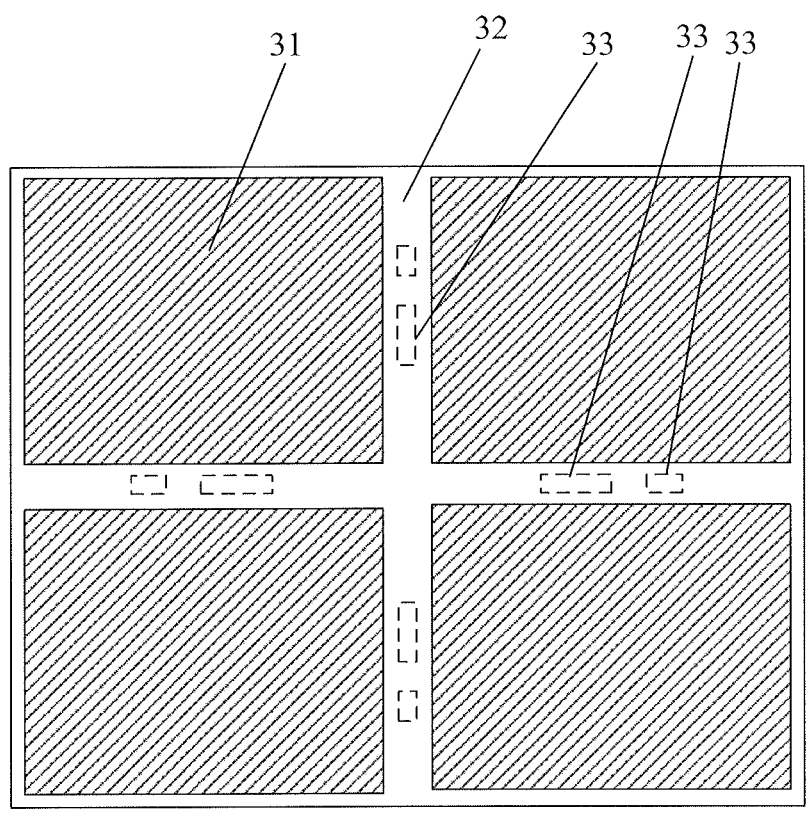
FIG. 4 is a schematic view illustrating positions of respective regions on a substrate when performing exposure using a mask of an embodiment of the present disclosure.

When the color film is exposed by using the mask provided in this embodiment, since it is unnecessary to provide the shading sheet above the first transparent region 4 of the mask, the operation flow of the exposure machine can be simplified, the exposure process can be simplified, and thereby improving productivity. Meanwhile, compared with shading the light with the shading sheet, the light of the second wavelength is directly filtered out by the first transparent region 4 according to the embodiment of the disclosure as shown in FIGS. 2 and 4, and thus there is no gray region in the embodiment of the disclosure, so that an area of the unpatterned region 33 on the substrate can be reduced, the exposure regions 31 can be closer to each other, and the width of the spacer region 32 can be smaller, thereby improving the utilization of the substrate, and at least partly solving the problem of yellowness issue of a displayer duo to the nonuniform distribution of liquid crystal when the substrate is aligned and assembled to form a cell.

In an embodiment, the second transparent region 5 further includes a redundant region (not shown) for forming a redundant pattern, wherein the redundant region is disposed at a periphery of first transparent regions 4. That is to say, during the exposure process, not only the color film pattern but also the redundant region is exposed to form the redundant pattern around a region (the unpatterned region 33) on the substrate corresponding to the first transparent region 4, thereby solving the problem of the nonuniform distribution of liquid crystal when the substrate is aligned and assembled to form a cell.

In an embodiment, the first wavelength is greater than 800 nanometers. That is, the first transparent region 4 may allow light having a wavelength greater than 800 nanometers to pass. Since the light such as a visible light or an ultraviolet light may denature a material to be exposed (for example, a color-film material) on the substrate, the first wavelength is selected to be greater than 800 nm. Specifically, the first wavelength may be 820 nm, so as to avoid influence of the light having the first wavelength on the material to be exposed on the substrate corresponding to first transparent region 4 during measurement and alignment.

Further, since the light of a wavelength less than 400 nm has a better exposure effect, the light of the second wavelength (exposure light) is selected to have a wavelength less than 400 nm. That is, the first transparent regions 4 may filter out the exposure light, while the second transparent regions 5 may allow the exposure light to pass through, so that only a pattern (for example, color film pattern, redundant pattern, etc.) corresponding to the second transparent regions 5 is formed on the substrate during the exposure process.

In an embodiment, the mask includes a transparent base layer; a filter film layer is disposed on the base layer at which the first transparent region is located, the filter film layer may allow the light of the first wavelength to pass through and filter out the light of the second wavelength. That is, a filter film layer is formed on the first transparent region 4 of the base layer so as to filter out the light of the second wavelength by the first transparent region 4.

In an embodiment, the light filter film layer includes a wideband light-splitting film. The wideband light-splitting film may allow the light of the first wavelength to pass and filter out (i.e., remove) the light of the second wavelength. Specifically, various of wideband light-splitting films, for example, a commercially available wideband light-splitting film, can be used.

Of course, it should be understood that, in the embodiment, a shading film serving as a light shelter for shading the light may be disposed at the shading region 6 of the transparent base layer, while no structure may be disposed at the second transparent region 5 of the base layer, thereby achieving transmission of light through the second transparent region 5.

As shown in FIG. 3 and FIG. 4, an embodiment provides an exposure device including any of the masks described above. The exposure device can be used for preparing a color film or a spacer, or the like on a substrate.

In an embodiment, the exposure device further includes an exposure machine, a light source, and the like. In an embodiment, the exposure machine is a progressive exposure machine.

When the exposure process is performed by the exposure device provided in this embodiment, a shading sheet above the first transparent region 4 of the mask is not required, so that the operation flow of the exposure machine can be simplified, the exposure process can be simplified, and thereby improving productivity. Meanwhile, compared with shading the light with the shading sheet, the light of the second wavelength is directly filtered out by the first transparent region 4 according to the embodiments of the disclosure, and thus there is no gray region in the embodiment of the disclosure, so that an area of the unpatterned region 33 on the substrate can be reduced, the exposure regions 31 can be closer to each other, and the width of the spacer region 32 can be smaller, thereby improving the utilization of the substrate, and at least partly solving the problem of yellowness issue of a displayer duo to the nonuniform distribution of liquid crystal when the substrate is aligned and assembled to form a cell.

As shown in FIG. 3 and FIG. 4, an embodiment provides an exposure method suitable for exposing a substrate by using the mask provided in the embodiment described above during preparation of a color film, a spacer, or the like.

The exposure method includes: disposing the mask between the substrate and a light source; performing a first process on the substrate by using the light of the first wavelength emitted by the light source; and exposing the substrate by using the light of the second wavelength emitted by the light source, wherein the first wavelength is different from the second wavelength.

The first process includes aligning process or measuring process, or the like.

Specifically, in the exposure method provided by the embodiment, an aligning process or measuring process is performed by irradiating the light of the first wavelength onto the first transparent region 4 of the mask; and then the substrate is exposed by irradiating the light of the second wavelength through the second transparent region 5 of the mask, so that a corresponding pattern (for example, the color film) is formed on the substrate.

It can be understood that, in this embodiment, the light source refers to a general used light-emitting device in the exposure method, but is not limited to a particular special light-emitting device. That is, in the embodiment, a light source that emits light of different wavelengths in different time periods can be used, or multiple light sources that respectively emit the light of the first wavelength and the light of the second wavelength can be used. Obviously, the present disclosure is not limited thereto.

In an embodiment, the substrate includes a plurality of exposure regions 31 spaced from each other at an interval and a spacer region 32 between adjacent exposure regions 31. The mask is used to expose respective exposure region 31 in the substrate sequentially. The second transparent region 5 of the mask corresponds to one exposure region 31 on the substrate, and the first transparent region 4 of the mask corresponds to the spacer region 32 of the substrate.

In this embodiment, exposure regions 31 of the substrate may be successively exposed by using a same mask so as to achieve overall exposure of the substrate. Specifically, for example, in a single exposure process, the first transparent region 4 of the mask corresponds to the spacer region 32 of the substrate, and an alignment mark corresponding to an alignment region 41 in the first transparent region 4 may be provided in the spacer region 32 of the substrate. The second transparent region 5 of the mask corresponds to the exposure region 31 of the substrate, and the color film pattern in the second transparent region 5 corresponds to the position of the exposure region 31 where the color film is to be formed.

According to the exposure method of the embodiments, it is unnecessary to provide a shading sheet above the first transparent region 4 of the mask, so that the operation flow of the exposure machine can be simplified, the exposure process can be simplified, and thereby improving productivity. Meanwhile, there is no gray region in the embodiment of the disclosure, so that an area of the unpatterned region 33 on the substrate can be reduced, thereby improving the utilization of the substrate, and effectively solving the problem of yellowness issue of a displayer duo to the nonuniform distribution of liquid crystal when the substrate is aligned and assembled to form a cell.

It will be understood that the above implementations are merely exemplary implementations for illustrating the principle of the present disclosure, and the present disclosure is not limited thereto. One of ordinary skill in the art may make various modifications and variations without departing from the spirit and scope of the present disclosure. These modifications and variations are regarded as within the scope of the present disclosure.

What is claimed is:

1. A mask for exposure, comprising:
a shading region, configured to allow no light to pass therethrough;
a first region, configured to allow light of a first wavelength to pass therethrough and filter out light of a second wavelength; and
a second region, configured to allow the light of the second wavelength to pass therethrough, wherein the light of the second wavelength is light for exposure, wherein
the first region comprises an alignment region configured to align the mask with a substrate and a measurement region configured to measure a distance between the substrate and the mask, each of only two intersecting edges among four edges of the mask being provided therein with both of the measurement region and the alignment region spaced apart from each other,
the mask comprises a base layer configured to allow light to pass therethrough,
light filter film layers are disposed on the base layer at which the alignment region and the measurement region are located, and
each of the light filter film layer in the alignment region and the light filter film layer in the measurement region is configured to allow the light of the first wavelength to pass therethrough and filter out the light of the second wavelength,
each of the measurement region and the alignment region has a rectangular shape, and a length of the rectangular measurement region is greater than a length of the rectangular alignment region,
the second region comprises a plurality of second transparent regions arranged in an array, the first wavelength is greater than 800 nm, and the second wavelength is smaller than 400 nm,
the light filter film layer comprises a wideband light-splitting film, and
a shading film is disposed at the shading region.

2. The mask of claim 1, wherein
the first wavelength is 820 nm.

3. An exposure device, comprising the mask of claim 1.

4. A method for exposure, comprising:
disposing the mask of claim 1 between a substrate and a light source;
performing a first process on the substrate by using the light of the first wavelength; and
exposing the substrate by using the light of the second wavelength,
wherein the first wavelength is different from the second wavelength.

5. The method of claim 4, wherein
the substrate comprises a plurality of exposure regions spaced from each other at an interval and a spacer region between adjacent exposure regions;
the mask is configured to expose each of the plurality of exposure regions of the substrate sequentially; and
the second region of the mask corresponds to one of the plurality of exposure regions of the substrate, and the first region of the mask corresponds to the spacer region of the substrate.

6. The method of claim 5, wherein an alignment marker is provided on the spacer region of the substrate, and the alignment marker corresponds to the alignment region in the first region.

7. The method of claim 4, wherein the first process comprises aligning or measuring.

8. A method for forming a color filter film, comprising:
disposing the mask of claim 1 between a substrate and a light source;
performing a first process on the substrate by using the light of the first wavelength; and
exposing the substrate by using the light of the second wavelength,
wherein the first wavelength is different from the second wavelength, and the light of the second wavelength is used for exposing a material of the color filter film.

9. The method of claim 8, wherein
the substrate comprises a plurality of exposure regions spaced from each other at an interval and a spacer region between adjacent exposure regions;
the mask is configured to expose each of the plurality of exposure regions of the substrate sequentially; and
the second region of the mask corresponds to one of the plurality of exposure regions of the substrate, and the first region of the mask corresponds to the spacer region of the substrate.

10. The method of claim 9, wherein an alignment marker is provided on the spacer region on the substrate, and the alignment marker corresponds to the alignment region in the first region.

11. The method of claim 8, wherein the first process comprises aligning or measuring.

* * * * *